(12) United States Patent
Zeifman

(10) Patent No.: US 9,817,045 B2
(45) Date of Patent: Nov. 14, 2017

(54) METHODS AND SYSTEM FOR NONINTRUSIVE LOAD MONITORING

(75) Inventor: Michael Zeifman, Sharon, MA (US)

(73) Assignee: Fraunhofer USA, Inc., Plymouth, MI (US)

( * ) Notice: Subject to any disclaimer, the term of this patent is extended or adjusted under 35 U.S.C. 154(b) by 883 days.

(21) Appl. No.: 13/993,935

(22) PCT Filed: Dec. 13, 2011

(86) PCT No.: PCT/US2011/064745
§ 371 (c)(1),
(2), (4) Date: Aug. 26, 2013

(87) PCT Pub. No.: WO2012/082802
PCT Pub. Date: Jun. 21, 2012

(65) Prior Publication Data
US 2013/0338948 A1    Dec. 19, 2013

Related U.S. Application Data

(60) Provisional application No. 61/422,315, filed on Dec. 13, 2010.

(51) Int. Cl.
*G01R 21/00*    (2006.01)
*G01R 21/133*   (2006.01)
(Continued)

(52) U.S. Cl.
CPC ......... *G01R 21/133* (2013.01); *G01D 4/002* (2013.01); *G06Q 50/06* (2013.01);
(Continued)

(58) Field of Classification Search
CPC ...... G01D 4/002; G01R 21/133; G06Q 50/06; Y02B 70/3266; Y02B 90/241;
(Continued)

(56) References Cited

U.S. PATENT DOCUMENTS 4,858,141 A    8/1989   Hart et al.
5,483,153 A    1/1996   Leeb et al.
(Continued)

FOREIGN PATENT DOCUMENTS

WO    WO 2009/103998    8/2009

OTHER PUBLICATIONS

Baranski et al., Nonintrusive appliance load monitoring based on an optical sensor. Power Tech Conf Proc, IEEE 2003;4: doi:10.1109/PTC.2003.1304732.
(Continued)

*Primary Examiner* — Elias Desta
(74) *Attorney, Agent, or Firm* — Wolf, Greenfield & Sacks, P.C.

(57) ABSTRACT

Identification and tracking of major electric appliances by using aggregate power data obtained at the main breaker level of a residence or commercial establishment. Step power changes and power surges characterize appliances. These features are identified and the time of use and duration statistics are considered to match an observed sequence of power changes with the appliances being turned on and off. The time-dependent usage of appliances and their power consumption are then reconstructed.

10 Claims, 10 Drawing Sheets

(51) Int. Cl.
*G01D 4/00* (2006.01)
*G06Q 50/06* (2012.01)

(52) U.S. Cl.
CPC ......... *Y02B 70/3266* (2013.01); *Y02B 90/241* (2013.01); *Y02B 90/245* (2013.01); *Y04S 20/242* (2013.01); *Y04S 20/32* (2013.01); *Y04S 20/38* (2013.01); *Y04S 20/40* (2013.01)

(58) Field of Classification Search
CPC ..... Y02B 90/245; Y04S 20/242; Y04S 20/32; Y04S 20/38; Y04S 20/40
See application file for complete search history.

(56) References Cited

U.S. PATENT DOCUMENTS

| | | | |
|---|---|---|---|
| 5,566,084 | A | 10/1996 | Cmar |
| 5,717,325 | A | 2/1998 | Leeb et al. |
| 5,924,052 | A | 7/1999 | Palm |
| 6,618,709 | B1 * | 9/2003 | Sneeringer ......... G06Q 30/0283 705/400 |
| 6,631,309 | B2 | 10/2003 | Boies et al. |
| 6,757,617 | B2 | 6/2004 | Dixon et al. |
| 6,816,078 | B2 | 11/2004 | Onoda et al. |
| 6,906,617 | B1 | 6/2005 | Van der Meulen |
| 6,937,946 | B1 | 8/2005 | Culp et al. |
| 7,181,293 | B2 | 2/2007 | Rothman et al. |
| 7,209,838 | B1 | 4/2007 | Wright et al. |
| 7,225,089 | B2 | 5/2007 | Culp et al. |
| 7,304,586 | B2 | 12/2007 | Wang et al. |
| 7,400,986 | B2 | 7/2008 | Latham et al. |
| 7,409,320 | B2 | 8/2008 | Wegerich |
| 7,561,977 | B2 | 7/2009 | Horst et al. |
| 7,684,441 | B2 | 3/2010 | Bickel et al. |
| 7,693,670 | B2 | 4/2010 | Durling et al. |
| 7,743,314 | B2 | 6/2010 | Stockmanns |
| 7,747,399 | B2 | 6/2010 | Smith et al. |
| 7,778,734 | B2 | 8/2010 | Oswald et al. |
| 7,783,390 | B2 | 8/2010 | Miller |
| 8,862,914 | B2 * | 10/2014 | Kansal ................. G06F 1/3203 713/300 |
| 2003/0093390 | A1 | 5/2003 | Onoda et al. |
| 2003/0135338 | A1 | 7/2003 | Knaus et al. |
| 2005/0165566 | A1 | 7/2005 | Happel |
| 2008/0106146 | A1 | 5/2008 | Baek et al. |
| 2008/0286622 | A1 | 11/2008 | Shaw et al. |
| 2009/0312969 | A1 | 12/2009 | Sundaresh et al. |
| 2010/0070215 | A1 | 3/2010 | Hyde et al. |
| 2010/0070218 | A1 | 3/2010 | Hyde et al. |
| 2010/0174419 | A1 | 7/2010 | Brumfield et al. |
| 2010/0191488 | A1 | 7/2010 | Wallace |
| 2010/0250440 | A1 | 9/2010 | Wang et al. |
| 2010/0287489 | A1 | 11/2010 | Alles |
| 2010/0305889 | A1 | 12/2010 | Tomlinson, Jr. et al. |
| 2011/0004421 | A1 * | 1/2011 | Rosewell ............... G01D 4/002 702/45 |

OTHER PUBLICATIONS

Chan et al., Harmonics load signature recognition by wavelets transforms. Proc of Intl Conf on Electric Utility Deregulation and Restructuring and Power Technologies (DRPT). Apr. 4-7, 2002:666-671.

Cole et al., Algorithm for non-intrusive identification of residential appliances. Proc of the 1998 IEEE Intl Symp on Circuits and Systems (ISCAS). May 31, 1998-Jun. 3, 1998;3:338-341.

Cole et al., Data extraction for effective non-intrusive identification of residential power loads. Proc of IEEE Instrumentation and Measurement Technology Conference (IMTC). May 18-21, 1998;2:812-815.

Cole et al., Nonintrusive identification of electrical loads in a three-phase environment base on harmonic content. Proc of the 17th IEEE Instrumentation and Measurement Technology Conference (IMTC). May 1-4, 2000;1:24-29.

Drenker et al., Nonintrusive monitoring of electric loads. Computer Applications in Power, IEEE. 1999;12:47-51.

Farinaccio et al., Using a pattern recognition approach to disaggregate the total electricity consumption in a house into the major end-uses. Energy and Buildings.1999;30:245-259.

Forney, The Viterbi algorithm. Proc IEEE. Mar. 1973;61(3):268-78.

Hanke et al., Electric load monitoring and control ion the domestic environment. Proc of IEEE Conf on Instrumentation and Measurement Technology. May 10-12, 1994;2:560-562.

Hart et al., Nonintrusive appliance load monitoring. Proc IEEE. Dec. 1992;80:1870-1891.

Ho et al., Signature representation of underground cables and its applications to cable fault diagnosis. Proc of IEEE Intl Conf on Advances in Power System Control, Operation and Management. Dec. 1993:861-865.

Laughman et al., Power signature analysis. Power and Energy Magazine, IEEE. 2003;1(2):56-63.

Leeb, A conjoint pattern recognition approach to nonintrusive load monitoring. PhD Thesis, MIT, Dept of Electrical Engineering and Computer Science. 1993.

Leeb et al., A multiscale transient event detector for nonintrusive load monitoring. Proc of the Intl Conf on Industrial Electronics, Control, and Instrumentation. Nov. 15-19, 1993:354-359.

Leeb et al., Transient event detection in spectral envelope estimates for nonintrusive load monitoring. IEEE Transactions on Power Delivery. 1995;10:1200-1210.

Marceau et al., Nonintrusive load disaggregation computer program to estimate the energy consumption of major end uses in residential buildings. Energ Cony and Manag. 2000;41:1389-1403.

Norford et al., Non-intrusive electrical load monitoring in commercial buildings based on steady-state and transient load-detection algorithms. Energy and Buildings. 1996;24:51-64.

Rabiner et al., An introduction to hidden markov models. IEEE ASSP Mag. Jan. 1986:4-16.

Roos et al., Using Neural networks for non-intrusive monitoring of industrial electrical loads. Proc of IEEE Conf on Instrumentation and Measurement Technology. May 10-12, 1994;3:1115-8.

Sultanem et al., Using appliance signatures for monitoring residential loads at meter panel level. IEEE Transactions on Power Delivery. 1991;6:1380-1385.

Scott Matthews et al., Quantifying the global and distributional aspects of American household carbon footprint. Ecological Econ. 2008;66:379-91.

International Search Report from PCT/US2011/064745, dated May 1, 2012.

* cited by examiner

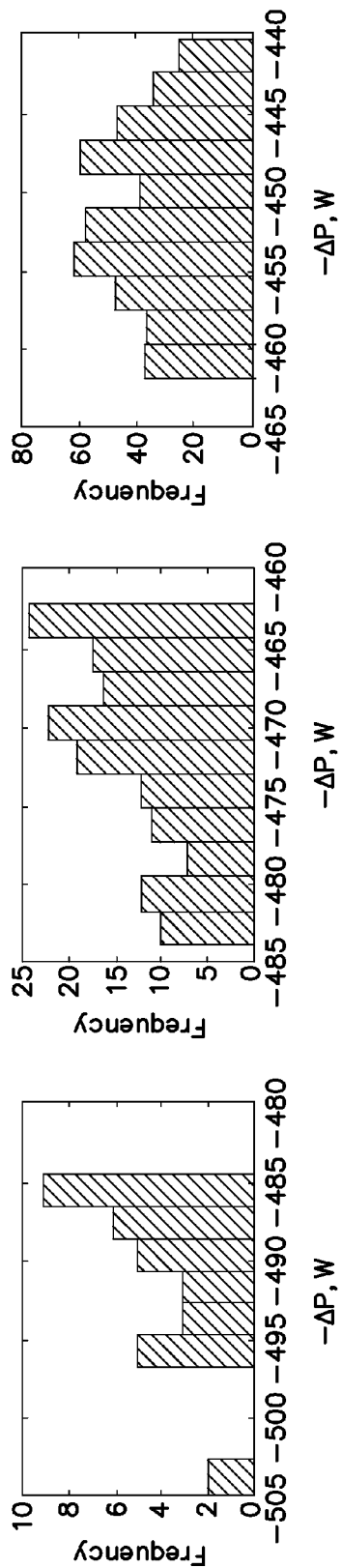

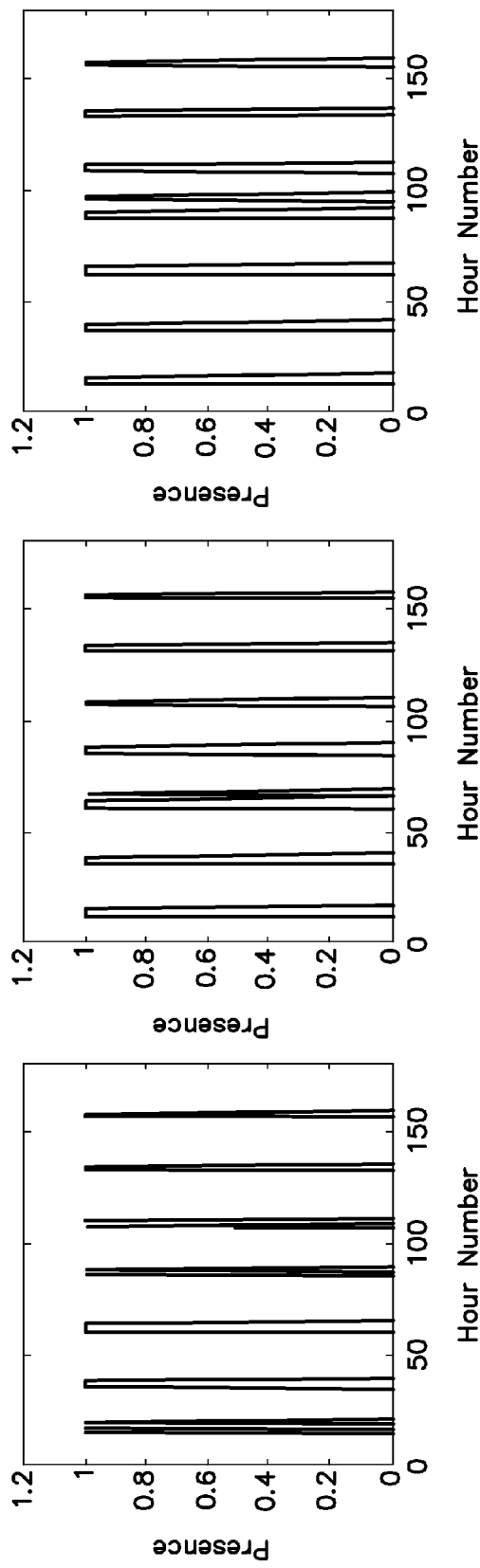

METHODS AND SYSTEM FOR NONINTRUSIVE LOAD MONITORING

RELATED APPLICATIONS

This application is a U.S. National Stage application based on International Application No. PCT/US2011/064745, filed Dec. 13, 2011, which claims priority under 35 U.S.C. §119(e) to United States Provisional Application Ser. No. 61/422,315, filed Dec. 13, 2010, the contents both of which are incorporated herein by reference in their entireties.

FIELD OF THE INVENTION

This invention relates to the field of monitoring and managing electrical power utilization in residential and commercial settings. More particularly, it relates to nonintrusive load monitoring in which aggregated power consumption data for a residential or commercial premise is disaggregated for use in connection with energy management.

BACKGROUND

There is widespread recognition that significant savings in electrical energy consumption can be achieved by better energy management and control in residential and commercial buildings. To achieve more efficient energy control, it would be helpful to have reasonably accurate real-time monitoring of the electrical loads (e.g., appliances, lighting devices, motors, etc.) in use. (Hereafter, the species term "appliance" is used interchangeably with the generic term "load," unless the context indicates a specific type of appliance is intended.) One way to obtain load-specific information about energy utilization is to monitor each load individually. However, this requires that energy usage be monitored at each appliance, either with apparatus internal to the appliance (thus raising the cost per appliance, especially to retrofit already installed appliances) or requiring an add-on device per appliance. Another way is to monitor total electricity consumption in the aggregate, at the main breaker or service feed level, and then disaggregating the data to separate out the timing and contribution of each load of interest. Armed with that information, attention can be given to more efficient usage of electrical energy, such as the savings that can be achieved by taking various steps (from changing an appliance to another model or time-shifting the use of an appliance, to any of a number of other measures). However, disaggregating the overall energy consumption into its constituent parts is a non-trivial task.

Such nonintrusive appliance load monitoring (NIALM) methods require both hardware (including a sensor and other elements) and software (i.e., signal processing algorithms executing on one or more processors) components. The software component of NIALM depends on the hardware component. For example, signal waveform analysis can be used if the sensor samples voltage and current at a rate of at least several kHz. However, such sensors are still expensive and not widely accessible. An inexpensive and easy-to-install hardware alternative is a sensor that measures the total electric power being delivered to a residential or commercial premise at a sampling frequency of about 1 Hz. NIALM algorithms corresponding to such sensor have been detailed in, for example, U.S. Pat. Nos. 4,858,141; 5,717,325; 5,483,153 and in several academic publications. These algorithms detect step changes in power and match these changes with the loads being turned on or off. The changes in power can either be one-dimensional (e.g., only real power is measured) or two-dimensional (e.g., both real and reactive power components are measured).

Even though these NIALM algorithms are capable of monitoring major household appliances and the like, their accuracy level is only in the neighborhood of 80%. The main reason for the monitoring accuracy being that low is that two or more different loads may be operated concurrently and even may be switched on or off in very close time proximity. Further, the amount of power two different loads consume could be quite similar. For example, the power draw of a computer monitor could approximately equal that of an incandescent bulb, which makes these two loads indistinguishable by the mentioned algorithms. Another significant cause for the low accuracy is that the mentioned algorithms consider one-for-one matching between a power change and the switching of a load state. This matching is prone to both measurement and algorithmic errors and to the ambiguity which results from a simultaneous starting or stopping of multiple loads.

Accordingly, a need exists for a NIALM system and method that can provide more accurate appliance (load) usage data.

SUMMARY

A new set of NIALM systems and methods (i.e., algorithms) shown herein is capable of significantly overcoming the above-noted challenges and addressing the observed need. There are three main advantages to these methods. First, not only load state changes but also power surges (statistics of surge amplitude and duration) and their statistical distributions are used in order to more accurately identify loads and their energy consumption. Second, statistics of time of use (in terms of both duration and time of day) are utilized for better appliance identification and matching with energy consumption. Third, the matching between the measured power observations and the appliances at the premise is made by consideration of those series of transitions among the appliance states which are possible, which maximizes the likelihood of correctly determining not only the given series of power changes but also the time-of-use statistics and power surge statistics.

In some embodiments, time statistics for power changes in the aggregated (common) power feed are estimated using historical data obtained empirically or from another source, based on a relatively "long" time interval. The aggregated power change data is reprocessed using those statistics, to cluster tuples of power changes (pairs, triples, etc.) which, statistically, would appear likely to be attributable to the same load. Using a Viterbi algorithm or similar technique, similar clusters then are merged, overlapping clusters are better separated and the time statistics are updated to estimate the times the loads appear to be in different states. Based on the updated statistics, real-time power-change measurements are then processed the same way, to cluster detected changes and develop real-time load state information. To associate that information with identifiable loads, one may correlate known load actions with the estimates (e.g., by logging at least one time a load is known to have been turned on and/or off and matching those actions to observed power changes).

Some embodiments involve a method for nonintrusive monitoring of electrical energy usage by a plurality of electrical loads at a premise supplied electrical power via a common feed. Such a method includes estimating time statistics for power changes in the common power feed using historical data, based on a relatively "long" time interval; reprocessing the aggregated power change data using those statistics, to cluster tuples of power changes which, statistically, appear likely to be attributable to the same load; merging similar clusters; separating overlapping clusters; updating the time statistics to estimate the times the loads appear to be in different states; and, based on the updated statistics, processing real-time power-change measurements according to some of the foregoing steps (reprocessing through updating) to cluster detected changes and develop real-time load state information.

Embodiments employing such a method may further include associating the real-time load state information with identifiable loads; and associating the real-time load state information with identifiable loads may comprise correlating known load actions with the estimates.

In embodiments employing any of the foregoing method examples, merging similar clusters may be performed using a modification of a Viterbi algorithm.

According to some embodiments, there is shown a method for nonintrusive monitoring of electrical energy usage by a plurality of electrical loads at a premise supplied electrical power via a common feed, comprising: via a sensor, providing a sensor output signal indicative of power delivered through the feed over a time interval; monitoring the sensor output signal to detect positive and negative changes of power, power surge amplitudes and durations; clustering negative changes of power; matching negative and positive changes of power; estimating times loads were turned on and turned off during an interval of interest; and statistically characterizing the operation of at least one of said loads.

In some embodiments, a method for nonintrusive monitoring of electrical energy usage by a plurality of electrical loads at a premise supplied electrical power via a common feed, includes monitoring load state changes and power surges and their statistical distributions are used in order to more accurately identify loads and their energy consumption. Second, statistics of time of use (in terms of both duration and time of day) are utilized for better appliance identification and matching with energy consumption. Third, the matching between the measured power observations and the appliances at the premise is made by consideration of those series of transitions among the appliance states which are possible, which maximizes the likelihood of correctly determining not only the given series of power changes but also the time-of-use statistics and power surge statistics.

In some embodiments a method is provided for nonintrusive monitoring of electrical energy usage by a plurality of electrical loads at a premise supplied electrical power via a common feed, comprising: via a sensor, providing a sensor output signal indicative of power delivered through the feed over a first time interval; monitoring the sensor output signal to detect positive and negative changes of power, power surge amplitudes and durations; clustering negative changes of power; matching negative and positive changes of power; estimating times loads were turned on and turned off during an interval of interest; and statistically characterizing the operation of at least one of said loads. Clusters may be sorted according to their mean values, a Viterbi algorithm then may be applied to n-tuples of said clusters; cluster conflicts are then resolved to provide a set of clusters disambiguating power changes; and appliance states are estimated based on the power changes represented by said set of clusters. Such a method also my involve updating clustering and appliance feature statistics based on the results of the previous operations. In some embodiments, for a second time interval shorter than the and later than the first time interval, the steps of sorting through estimating may be re-performed on clusters created from power changes sensed by the sensor during the second time interval.

In some embodiments, a method may be practiced for nonintrusive monitoring of electrical energy usage by a plurality of electrical loads at a premise supplied electrical power via a common feed, comprising: detecting aggregate load state changes and power surges and their statistical distributions; and matching detected power observations and the appliances at the premise by consideration of those series of transitions among the appliance states which are possible and eliminating from consideration state changes which are not permitted or are statistically improbable to maximize the likelihood of correctly determining the loads to which the detected series of power changes pertain.

Another aspect of the invention, appearing in some embodiments, is a system for nonintrusive monitoring of electrical energy usage by a plurality of electrical loads at a premise supplied electrical power via a common feed, comprising: a power sensor configured and arranged to monitor aggregate power consumed at the premise; means for detecting changes in the monitored power; and a processor executing stored program instructions to disambiguate the detected power changes and associate them with individual loads by clustering power changes and, by means of a Viterbi algorithm, matching clusters to identify power changes associated with individual loads.

BRIEF DESCRIPTION OF THE DRAWINGS

A set of drawing figures is provided, to be reviewed in conjunction with the detailed description of some embodiments, for a fuller understanding thereof. Like reference designations in the figures are intended to refer to the same or corresponding elements. In the drawings.

DETAILED DESCRIPTION OF EMBODIMENTS

Attention is now directed to FIGS. 1-7, which illustrate an embodiment of a system and method for practicing aspects of the inventive concepts disclosed herein. In embodiments according to these drawing figures, it is presumed that the loads are limited to those with only two states, "on" and "off." Later, extension of the discussed examples to loads having multiple power-consuming states will be disclosed. However, in a commercial premise, it is reasonable to expect the majority of loads to be of the two-state type, such as lighting and devices in the heating, ventilation and air conditioning (HVAC) systems, such as compressors, fans and heating apparatus. So initially limiting discussion to two-state loads still includes a large category of uses.

Figure 1:
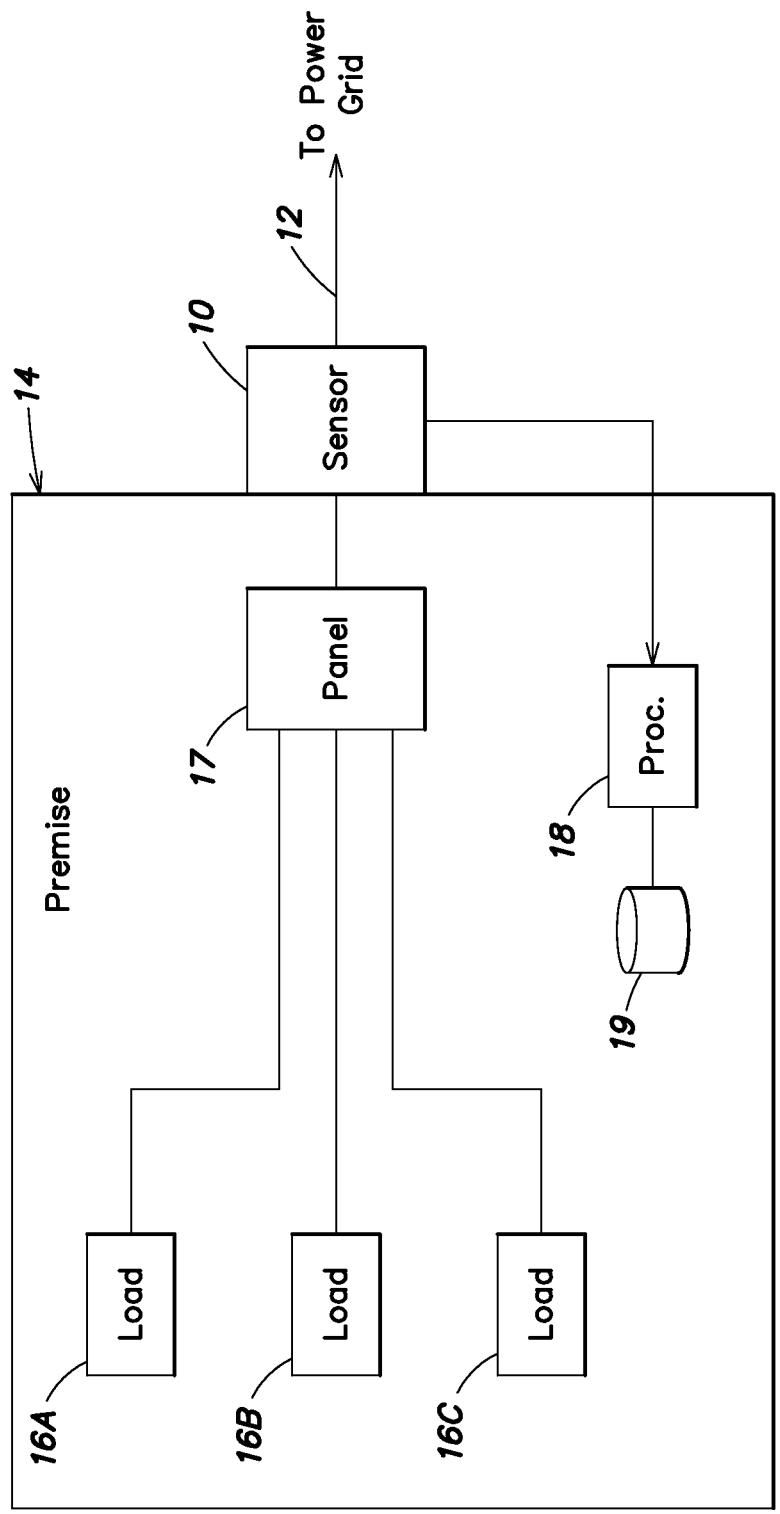
FIG. 1 is a block diagram of a system according to inventive concepts set forth herein and in which the herein-disclosed methods may be employed.

With reference to FIG. 1, a sensor 10 is connected to monitor an electrical power feed line 12 such as a service feed to a residential or commercial premise 14. Power is distributed within premise 14 to a number of loads such as loads 16A, 16B and 16C, through a service panel 17. The sensor may be of conventional design and should be one that provides an output signal that varies according to aggregate energy flow in the feed line. The output signal may be an analog voltage or current or a digital value. Alternatively, in some embodiments a sensor may be employed that is responsive to, or outputs a signal indicative of current, current changes or voltage changes on the feed line (e.g., at a service entry point), though a signal indicative directly of power is preferable. In some embodiments, the sensor may be integrated into an electrical energy consumption meter such as a utility provider may employ to measure and bill for energy usage. Sensor 10 delivers its output signal, directly or indirectly (e.g., via an analog-to-digital converter, not shown, if the sensor output signal is in analog form) to a processor 18 (e.g., a microprocessor), which executes stored program instructions from a non-transitory storage medium 19, to implement signal processing methods as discussed below. Processor 18 and storage medium 19 are shown as being situated at the premise 14 but this is not necessary. They could just as well be remotely located provided the sensor 10 is coupled to an appropriate communication mechanism to feed its output via a communication interface and a communications medium, wired and/or wireless, to the remote processor. For example, the sensor might employ a power line communications network to send its output to the processor.

FIGS. 2-7 illustrate an exemplary method for processing changes in aggregate energy consumption (or, to be more precise, instantaneous power delivery) via a premises electrical utility service cable.

Figure 2:
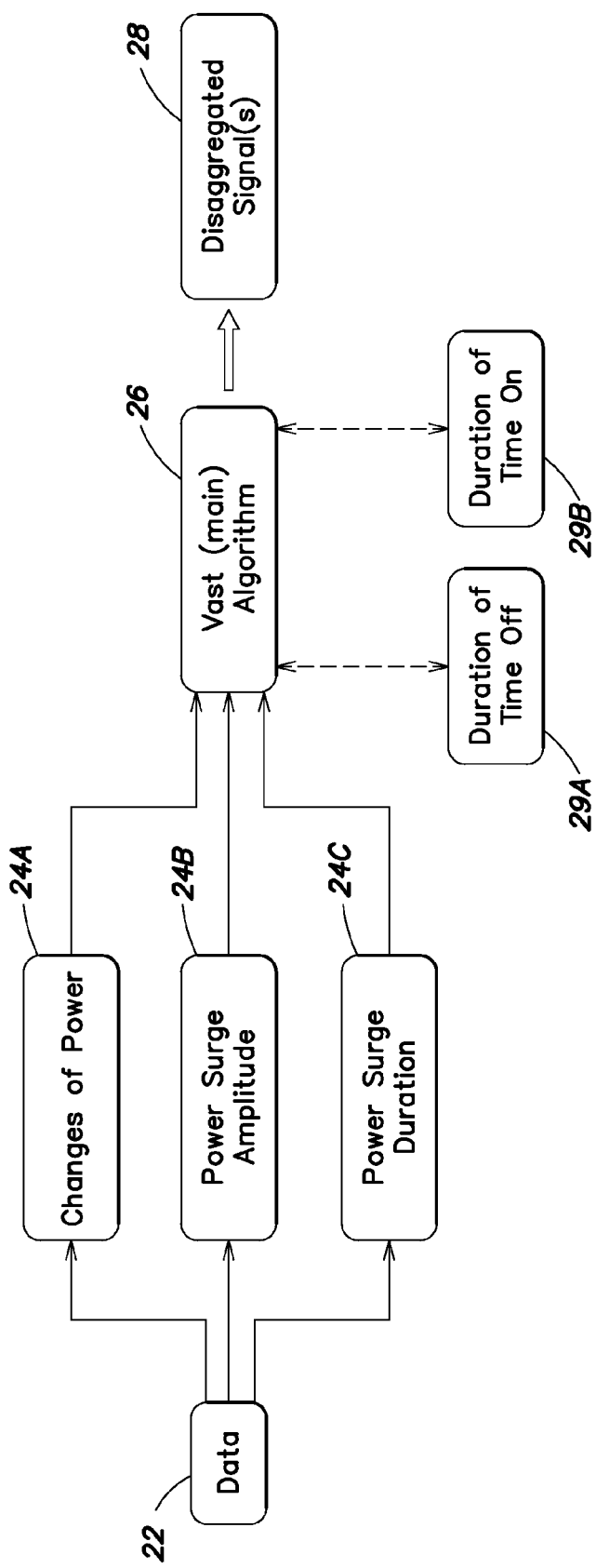
FIG. 2 is a high-level diagrammatic illustration of information processing according to herein-disclosed inventive concepts.

Turning first to FIG. 2, there is shown conceptually the flow of information according to the methodology described herein. A sensor such as sensor 10 produces data 22. This data is analyzed to extract three types of information: detected changes of power levels, 24A; power surge (transient) amplitudes, 24B, and power surge durations, 24C. That information is processed using processor 18 to execute signal processing methods (algorithms) 26 described below, to produce disaggregated load signals 28.

The signal processing methods 26 may have three stages: a preliminary processing stage, a main stage in which historical power usage for the premise is analyzed, and a real-time stage in which the same techniques are used as in the main stage but in which near real-time data is processed.

Preliminary Processing

Figure 3:
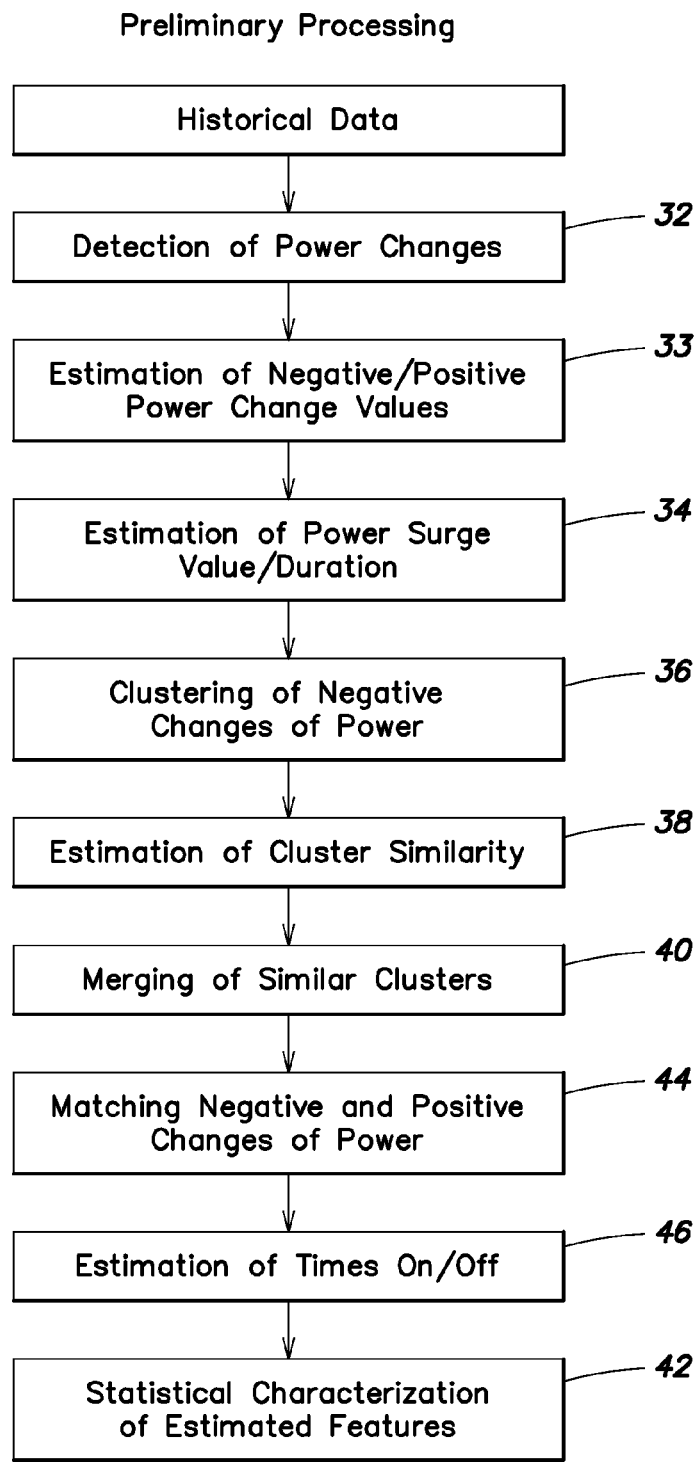
FIG. 3 is a flow chart depicting an example embodiment of preliminary stage information processing of historical power change data according to a herein-disclosed method for disaggregating power changes.
Figure 4:
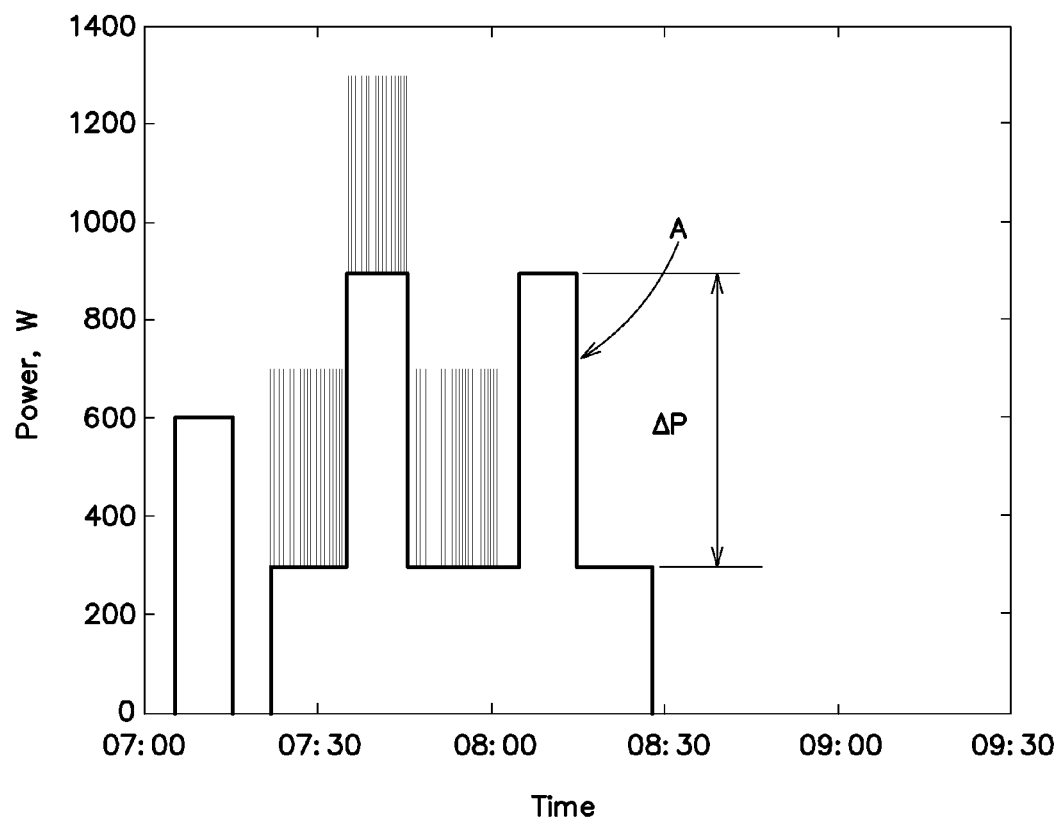
FIG. 4 is an example of an aggregated power consumption signal from a sensor as discussed herein, for purposes of identifying a typical negative power change.

As shown in FIG. 3, the preliminary stage 30 of the signal processing method (algorithm) starts with analyzing and modeling historical data about power usage at the premise, i.e. - the data collected by a sensor over a significant interval, e.g., a two-week interval. Step-wise changes of power consumption are firstly identified, step 32, and the magnitude of positive and negative changes are estimated. Step 33. Initial emphasis is on negative changes of power consumption (i.e., sudden drops) (see the drop A, for example, in FIG. 4). These negative changes indicate a reduction in energy consumption and usually correspond to an appliance being turned off (or, in the case of loads operable in multiple states, to an appliance changing its operating state from one "on" state to another "on" state; such loads will be addressed below).

Figure 5:
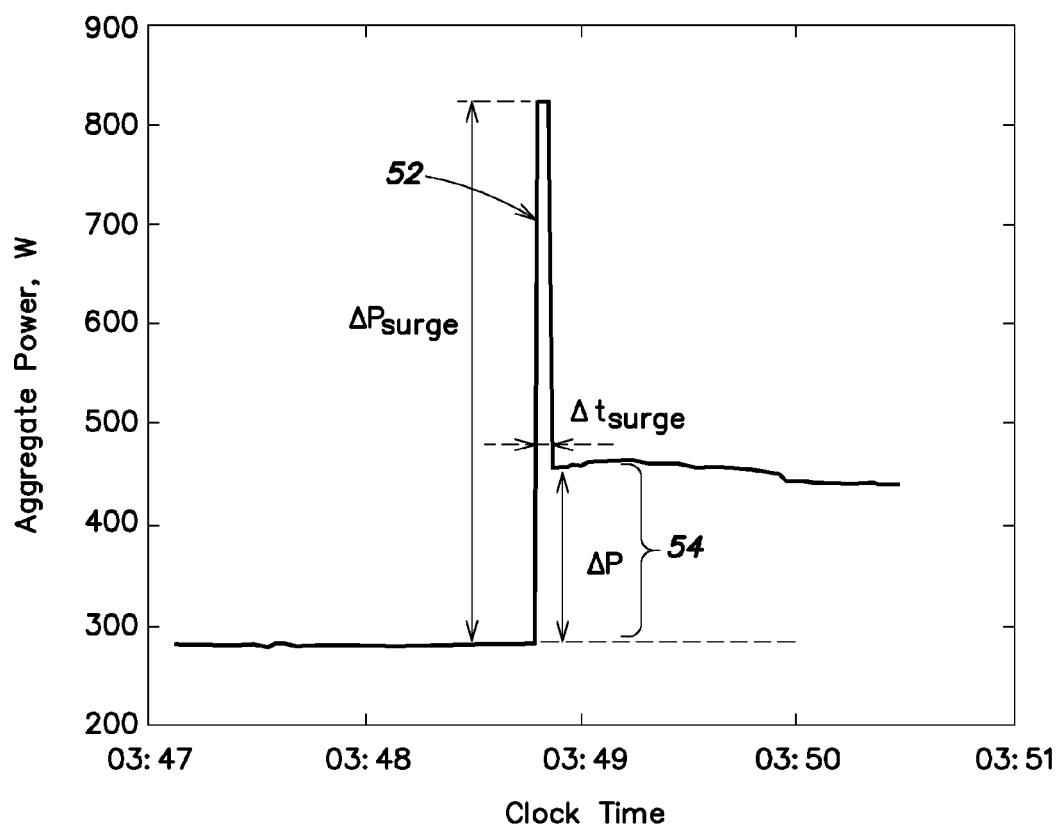
FIG. 5 is an example of a typical positive power change in an aggregated power consumption signal from a sensor as discussed herein, for purposes of identifying a typical power surge.

For positive changes in power consumption, note that some appliances pull a surge of power to start. Therefore, erroneous readings for the magnitude of the change may occur unless a post-surge value is used for the positive power change. FIG. 5 shows an example of a surge 52 and of the post-surge power change 54. The surge, or transient, 56, is characterized by its magnitude ($\Delta P_{surge}$) and duration ($\Delta t_{surge}$). The surge magnitude and duration are estimated in step 34.

Due to measurement errors and natural variability of conditions, the measured negative change of power when a given appliance is turned off will not be single-valued, but will be distributed (scattered) about a nominal value. Therefore, in order to identify appliances, the identified negative changes of power are grouped into clusters, step 36, using an appropriate statistical method, e.g., the well-known and popular ISODATA clustering algorithm (see, e.g., Tou, J. T., *Pattern Recognition Principles*, New York, Addition-Wesley, 1974, hereby incorporated by reference, or other references). Each such cluster may correspond to a separate appliance being turned off. The positive changes of power are not clustered at this stage.

The clustering procedure can result in errors, of course. A single appliance can yield both positive and negative power changes that correspond to multiple identified clusters. Those clusters then need to be merged in order to have a complete record for that appliance. Additionally, multiple appliances can correspond to a single cluster, which then needs to be split.

Merging of clusters based on negative power changes occurs in steps 38 and 40. For cluster merging, the empirical statistics of appliance usage in time are calculated. The statistics can be, for example, the hourly presence or absence of a negative change of power for a given cluster. That is, a binary variable or function may be defined which denotes whether a negative change of power occurred during each hour. If at least one negative change of power within the boundaries of a given cluster occurred during a given hour, then the function of hourly presence for that cluster at the given hour may be assigned the value "1". Otherwise, the function of hourly presence for that cluster at the given hour is assigned the value "0." The degree of similarity of load usage between cluster pairs is then estimated. Step 38. This may be done, for example, by calculating a fraction of hours during which both clusters are present (i.e., their functions of hourly presence both have a value of 1). Then adjacent cluster pairs whose degree of load usage similarity exceeds a threshold are merged. Step 40.

Figure 6G:
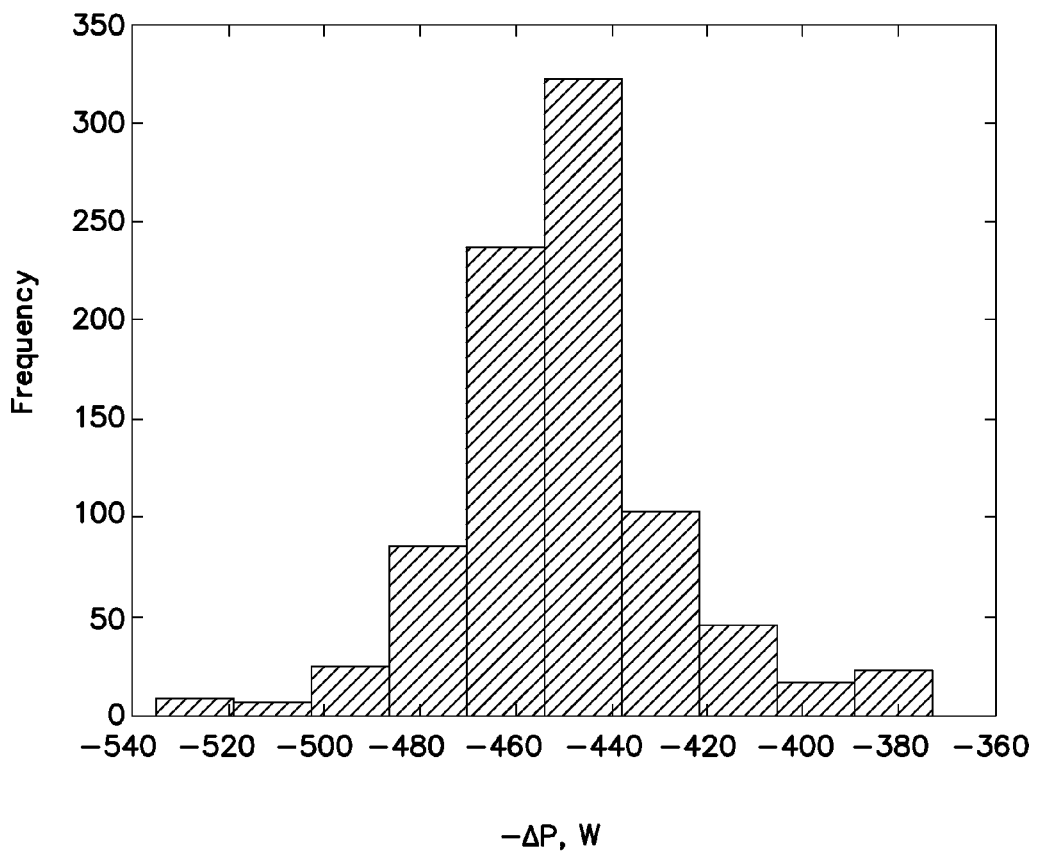
FIG. 6 is a set of three views of example adjacent clusters, A-C, of typical power change frequency profiles, their corresponding hourly presence in time functions D-F and the resulting cluster merger profile, G.
Figure 7:
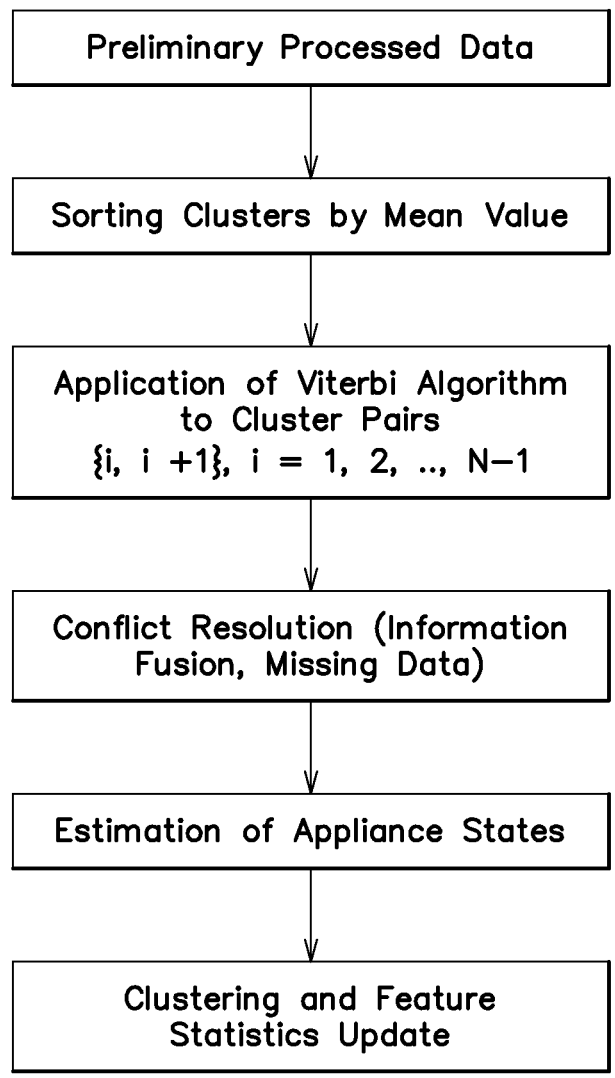
FIG. 7 is a flow chart of an example of a typical "main" algorithm according to these teachings, used first on historical data and then to process real-time or near real-time power change data.

FIG. 6 shows an example of cluster merging. Three clusters (A-C) shown in the Figure are adjacent clusters identified by the aforementioned ISODATA algorithm. They all have similar hourly presence in time (D-F on FIG. 6). Therefore, they are merged together (G).

After merging, the clusters are numbered in the order of their mean values. In each cluster, the negative power changes are characterized statistically in parametric form, e.g., by fitting their empirical distribution to a Gaussian mixture model (Tou, 1974) or to a Laplace distribution mixture. Experience suggests that a two-component Gaussian or Laplace mixture model of the probability density function (PDF) is sufficient in most cases; however, other parametric distribution models can be used. Note that the cluster boundaries may overlap.

Preliminary time statistics of appliances being in states "on" and "off" are then estimated. Step 42. To this end, each identified negative power change j of magnitude $-\Delta P_{ij}$ that occurred at time $t_j$ and came from cluster i (i=1, 2, . . . , n, where n is the total number of clusters after merging), is matched with a positive power change k of magnitude $\Delta P_{ik}$ that occurred earlier, at time $t_k$. Step 44. An exact equality between the positive and negative power changes for a match is not required, instead, a tolerance $\delta$ is used:

$$\Delta P_{ik} \in \Delta P_{ij}(1 \pm \delta). \qquad \text{Eq. 1}$$

At this stage, the match is considered to be the first $\Delta P_{ik}$ satisfying Eq. (1) when going backward in time from the $-\Delta P_{ij}$. In this way, for each cluster i, a sample set of intervals or times "on" $\{t_{on}\}_i$ is constructed by calculating $t_{on}=t_j-t_k$ for each available matching pair. Similarly, a sample set of intervals or times "off" $\{t_{off}\}_i$ is constructed by calculating $t_{off}=t_{k+1}-t_j$. Step 46. Once both sample sets are available for each cluster, the cumulative distribution functions (CDF) of $t_{on}$ and $t_{off}$ for each cluster are calculated. Step 42. (Other time-dependent statistics, e.g., the clock-time probability of use, can also be implemented for cluster characterization.)

A collection of the positive power changes that match the negative power changes from cluster i is considered to be cluster $i_{plus}$. In each such cluster, the statistical distribution of the positive power changes is parametrically characterized, e.g., by fitting the empirical distribution to a two-component Gaussian or Laplace mixture. In each cluster $i_{plus}$, the surges are also statistically characterized. The surge magnitude ($\Delta P_{surge}$) and duration ($\Delta t_{surge}$) are used to obtain a sample set of surge magnitudes and a sample set of surge durations for cluster $i_{plus}$. Then, the PDFs of $\Delta P_{surge}$ and duration $\Delta t_{surge}$ for each cluster are fitted, e.g., to a Gaussian mixture model. Table 1 summarizes the statistics that preferably are obtained in the preliminary processing. Note, that the waveform signal features obtainable at a higher sampling rate can also be included in Table 1 in a similar manner and included into the main algorithm described in the next section.

TABLE 1

| Cluster i characteristic | Statistical characterization |
| --- | --- |
| Negative change of power, W | Parametric PDF (Gaussian or Laplace mixture), $P_{i(-)}$ |
| Positive change of power, W | Parametric PDF (Gaussian or Laplace mixture), $P_{i(+)}$ |
| Time on, s | CDF (non-parametric), $C_{on,i}$ |
| Time off, s | CDF (non-parametric), $C_{off,i}$ |

TABLE 1-continued

| Cluster i characteristic | Statistical characterization |
| --- | --- |
| Surge magnitude, W | Parametric PDF (Gaussian or Laplace mixture), $s_{m,i}$ |
| Surge duration, s | Parametric PDF (Gaussian or Laplace mixture), $s_{d,i}$ |
| Presence in time | Binary function of clock time, $B_i$ |

Main Process for Historical Data

The main process is intended to better match the negative and positive changes of power and resolve ambiguities relating to the simultaneous starting or stopping of two or more appliances, measurement/processing errors, and the overlap between adjacent clusters. This process works as follows.

Consider adjacent clusters of negative power changes i and i+1. Each of these clusters includes the detected negative power changes that range from $-\Delta P_{i\_max}$ to $-\Delta P_{i\_min}$ and from $-\Delta P_{i+1\_max}$ to $-\Delta P_{i+1\_min}$ for clusters i and i+1 correspondingly. Note that, because of the potential overlap $-\Delta P_{i\_min} \neq -\Delta P_{i+1\_max}$. The information pertinent to these clusters also includes the hourly usage statistics and the time on/time off statistics.

Consider the detected positive power changes. The positive power changes $\Delta P_k$ are considered to be candidates for matching with the clusters i or i+1 if they are within the matching boundaries plus the tolerance:

$$\Delta P_{i+1,min}(1-\delta) \leq \Delta P_k \leq \Delta P_{i,max}(1+\delta) \qquad \text{Eq. 1}$$

Note that the boundaries, Eq. (2), are generally broader than those corresponding to the positive clusters $i_{plus}$ and $(i+1)_{plus}$.

Clusters i and $i_{plus}$ presumably correspond to appliance i, whereas clusters i+1 and $(i+1)_{plus}$ correspond to appliance i+1. Since each of the appliances i and i+1 can either be in the "on" or "off" states, the total number of states in the system that includes both appliances is four. These states are listed below.

TABLE 2

| State | Appliance i | Appliance i + 1 |
| --- | --- | --- |
| 1 | off | off |
| 2 | on | off |
| 3 | off | on |
| 4 | on | on |

The system with the states shown in Table 2 can transition from one state to another as soon as a new power change within the boundaries is recorded. The states and the transitions within these states are hidden for an observer, whereas the changes of power are observable. The sequence of transitions of the system is directly related to the sequence of the observations, and the current system state depends on the previous state through transition probabilities. Therefore, this system can be represented by a hidden Markov model (HMM) and the hidden path of state transitions can be estimated by a well-known Viterbi algorithm.

Tables 3 (positive change $\Delta P$ with a surge) and 4 (negative change) list the probabilities in terms of Tables 1 and 2.

TABLE 3

| Transition between states | Probability |
| --- | --- |
| 1 → 1 | 0 |
| 1 → 2 | $\dfrac{\alpha_{12}}{\alpha_{12} + \alpha_{13}}$, $\alpha_{12} = P_{i(+)}(\Delta P)s_{m,i}(\Delta P_{surge})s_{d,i}(\Delta t_{surge})\Delta C_{off,i}(t_{12})[1 - C_{off,i+1}(t_{13})]$ |

TABLE 3-continued

| Transition between states | Probability |
|---|---|
| 1 → 3 | $\frac{\alpha_{13}}{\alpha_{12}+\alpha_{13}}$, $\alpha_{13} = P_{i+1(+)}(\Delta P)s_{m,i+1}(\Delta P_{surge})s_{d,i+1}(\Delta t_{surge})\Delta C_{off,i+1}(t_{13})[1 - C_{off,i}(t_{12})]$ |
| 1 → 4 | 0 |
| 2 → 1 | 0 |
| 2 → 2 | 0 |
| 2 → 3 | 0 |
| 2 → 4 | 1 |
| 3 → 1 | 0 |
| 3 → 2 | 0 |
| 3 → 3 | 0 |
| 3 → 4 | 1 |
| 4 → 1 | 0 |
| 4 → 2 | 0 |
| 4 → 3 | 0 |
| 4 → 4 | 0 |

TABLE 4

| Transition between states | Probability |
|---|---|
| 1 → 1 | 0 |
| 1 → 2 | 0 |
| 1 → 3 | 0 |
| 1 → 4 | 0 |
| 2 → 1 | 1 |
| 2 → 2 | 0 |
| 2 → 3 | 0 |
| 2 → 4 | 0 |
| 3 → 1 | 1 |
| 3 → 2 | 0 |
| 3 → 3 | 0 |
| 3 → 4 | 0 |
| 4 → 1 | 0 |
| 4 → 2 | $\frac{\alpha_{42}}{\alpha_{42}+\alpha_{43}}$, $\alpha_{42} = P_{i(-)}(-\Delta P)\Delta C_{on,i+1}(t_{42})[1 - C_{on,i}(t_{43})]$ |
| 4 → 3 | $\frac{\alpha_{43}}{\alpha_{42}+\alpha_{43}}$, $\alpha_{43} = P_{i(-)}(-\Delta P)\Delta C_{on,i}(t_{43})[1 - C_{on,i+1}(t_{42})]$ |
| 4 → 4 | 0 |

The transition probabilities listed in Tables 3 and 4, along with the estimated statistics listed in Table 1, can be applied to the series of positive and negative power changes through the Viterbi-type algorithm. However, those skilled in the art will conclude from observation of Tables 3 and 4 that there are two peculiarities that may hamper the implementation of the Viterbi-type algorithm. First, several transitions between the states are forbidden, which may render the algorithm unsolvable. Second, the transition probabilities of this system are time-dependent, which calls for additional calculations of the time intervals $t_{12}$, $t_{13}$, $t_{42}$ and $t_{43}$. The time-dependent probabilities also make the current system state dependent on several previous states and not on just one previous state. The algorithm will be unsolvable, e.g., in case of a missing power change or in case of a wrong power change, which in turn can be, e.g., the result of a simultaneous starting or stopping of two or more appliances or a measurement/processing error. The missing power change can result, e.g., from a ramping up of power consumption when an appliance starts up, so that the power change gets split. In case of such insolvency, the method can be adapted in such a way as to yield a special state, e.g., 0, each time the insolvency occurs. After the historical data has been processed for the clusters i and $i_{plus}$, these special state occurrences can be found and the corresponding power changes can be separated and excluded for further consideration. The procedure then is reapplied to the remaining data. The foregoing process can be repeated several times until the number of the insolvencies is below a pre-defined threshold.

Figure 8:
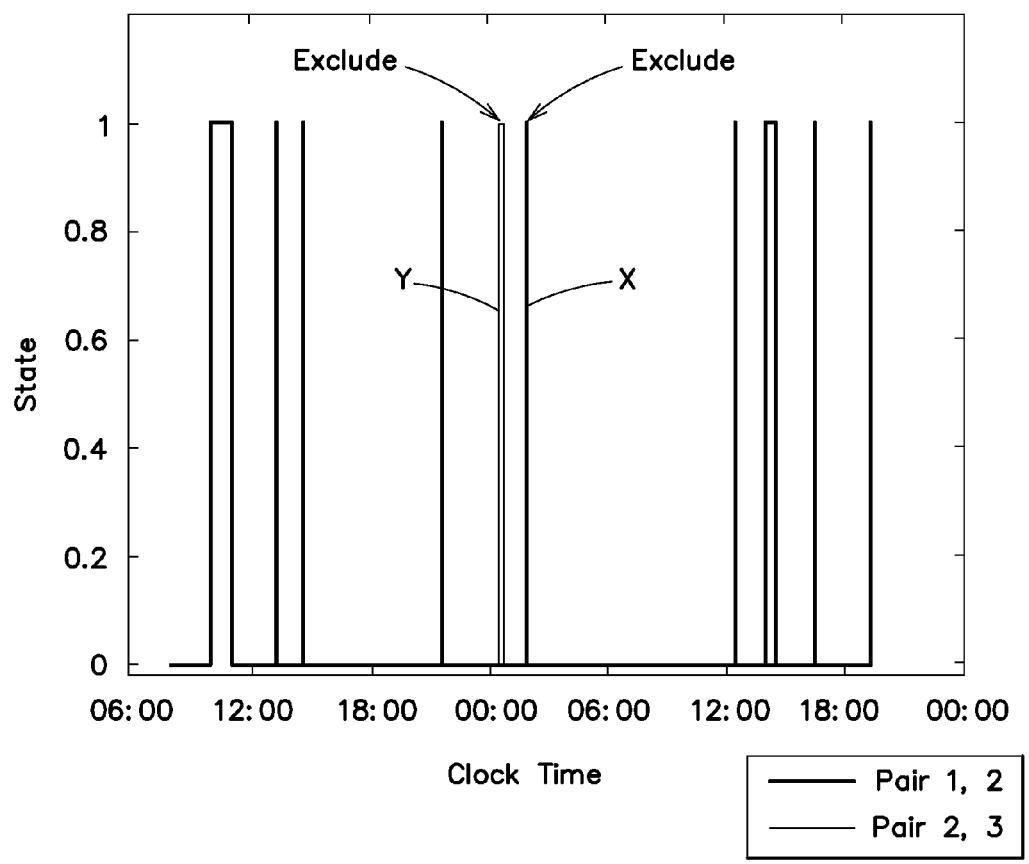
FIG. 8 is an illustration of an example of cluster states as a function of time, showing how the application of one of the concepts presented herein can be used to exclude from a cluster a state not appearing in two adjacent cluster pairs.

The procedure is firstly applied to clusters 1 and 2, then to clusters 2 and 3, ..., n-1, n. In this way, every cluster but the first and the $n^{th}$ will be processed twice. For each cluster k, k=2, 3, ..., n-1, the series of its states obtained by the above process to the pair k-1, k is compared to that obtained for clusters k, k+1. Since the main purpose of the process for historical data is better separation of clusters, those states of cluster k that do not appear in both algorithmic solutions are excluded, together with the earlier considered states resulting in insolvency. FIG. 8 gives an example of such exclusion. The state of cluster 2 when paired with cluster 1 at X (a first solution) does not coincide with that at Y when cluster 2 is paired with cluster 3 (a second solution). Hence, the states X and Y are excluded.

Another strategy for dealing with the missing power changes can be consideration of non-zero probability of the system to remain in the same state. This strategy is also applicable to the problem of overlapping clusters, in which case there are "foreign" power changes, i.e., the changes that came from the adjacent clusters. If the probabilities of transitions 1→1, 2→2, 3→3, 4→4 (see Tables 3, 4) are non-zero, then a missing power change will no longer cause the system to remain in the previous state. This probability is proportional to the probability of an appliance (called an "external" appliance), other than the two considered appliances, being turned on or off and producing an observed power change $\Delta P$ or larger. Analogously, the presence of the foreign power changes will make the probabilities of all other previously forbidden transitions to be non-zero. Therefore, the transition probability matrix may be modified to account for the transitions from "external" appliances.

The transition probability matrix with the possibility of such external transitions is listed in Table 5 for negative changes of power. A matrix for positive power changes with the external transitions can be obtained similarly. The exact probabilities can be straightforwardly calculated similarly to the calculations underlying Tables 2 and 3.

TABLE 5

| Transition between states | Probability |
|---|---|
| 1 → 1 | point from external cluster |
| 1 → 2 | missing point from state 2 AND point from external cluster |
| 1 → 3 | missing point from state 3 AND point from external cluster |
| 1 → 4 | 2 missing points (states 2 AND 3) AND point from external cluster |
| 2 → 1 | $\propto w_{i+1}P_{i(-)}(-\Delta P)\Delta C_{on,i}(t_{21})[1 - C_{off,i+1}(t_{24})]$ |
| 2 → 2 | point from external cluster |
| 2 → 3 | missing point from state 4 AND is 4→3 transition |
| 2 → 4 | missing point from state 3 AND point from external cluster |
| 3 → 1 | $\propto [w_{i+1}P_{i(-)}(-\Delta P)[1 - C_{off,i}(t_{34})]\Delta C_{on,i+1}(t_{31})]$ |
| 3 → 2 | missing point from state 4 AND is 4→2 transition |
| 3 → 3 | point from external cluster |
| 3 → 4 | missing point from state 4 AND is 4→2 transition |
| 4 → 1 | missing point (states 2 OR 3) AND is (2→1 OR 3→1) transition |
| 4 → 2 | $\propto w_{i+1}P_{i(-)}(-\Delta P)\Delta C_{on,i}(t_{42})[1 - C_{on,i}(t_{43})]$ |
| 4 → 3 | $\propto w_i P_{i(-)}(-\Delta P)\Delta C_{on,i}(t_{43})[1 - C_{on,i+1}(t_{42})]$ |
| 4 → 4 | point from external cluster |

The processing technique under this strategy can take several forms. For example, the processing can be done in triplets (e.g., clusters i, i−1, and i+1) or even larger clusters, for more accuracy, considering the cluster as an n-tuple of points, where n is the number of points (power changes) in the cluster. At each triplet (i.e., 3-tuple), the pairs i, i−1 and i, i+1 are firstly independently processed as described above. Then the points of no state change are identified. Such points in the first pair, if they match those identified in the second pair, are excluded from consideration in the first pair, and the modified Viterbi algorithm is reapplied to the first pair. The same processing next is applied to the second pair. After this processing, the information on points belonging to cluster i is fused from the two pairs using the maximum probability principle. That is, if point # k was identified as belonging to cluster i in both pairs, it is accepted as belonging to cluster i. If point # k was found to belong to cluster i in the first pair (or in the second pair), but to belong to cluster i+1 in second pair (or to i−1 in first pair), the probabilities of these two possibilities are compared. If the first possibility has a higher probability, point # k is concluded to belong to cluster i.

After all pairs of clusters have been processed, the power changes corresponding to the excluded or separated states are considered. Various strategies can be applied to processing these power changes. For example, if several excluded power changes occur within a given time interval, they can be merged together. Isolated-in-time power changes can be split: $\Delta P = \Delta P_1 \pm \Delta P_2$, where $\Delta P_1$ and $\Delta P_2$ are within the boundaries of any two clusters. The algorithm is then reapplied to the power change data modified in this way.

After the successive algorithm processing of the historical data, the statistical characteristics of the clusters (see Table 1) are updated. Each obtained empirical distribution of times on/off is then statistically tested for multi-modality. If significant multi-modality is detected, then the corresponding clusters preferably are split, e.g., using clustering of the times that have exhibited the bimodality.

Once the clustering of the power changes has been finalized, the clusters can be named by corresponding appliances using, e.g., the information of the power draw and usage patterns.

Main Algorithm for Near Real-Time Data

Once historical data has been processed to establish starting statistics, power usage is monitored in real-time or near real-time, using substantially the same methodology. However, instead of considering data over a lengthy time period, a data window of a shorter reasonable size, e.g., the most recent 24 hours, is used. Each time a new power change is detected, it is processed as previously described.

Since the algorithm is intended to resolve the likeliest state path, i.e., the most probable sequence of appliances' states, the appliance states estimated at a given time will be re-estimated as soon as new data are obtained and processed.

In the example embodiments discussed above, a modified Viterbi algorithm was used for pairs of appliances, instead of applying it simultaneously to the N appliances at a premise. By doing so, the interactions between appliance (cluster) i and i±3, i±4, i±5, etc. are essentially neglected. This is because the overlap in power draw between them is supposed to be small. On this account, computational complexity becomes linearly proportional to the number of appliances, whereas the conventional use of a Viterbi algorithm would result in an exponential dependence. When the overlap between cluster i and i+3 is not negligible, one may consider using triples instead of pairs. In a triple, the number of states would be 2^3=8 and number of transitions=64, which is still manageable. If triplets are not enough, then quadruplets and so on can be used. In any case, by decomposing of the whole system into such small units, the computational complexity is decreased by many orders of magnitude.

Having described inventive concepts as well as some example embodiments in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method for nonintrusive monitoring of electrical energy usage by a plurality of electrical loads at a premise to which electrical power is supplied via a common feed, comprising:

clustering, using at least one processor, tuples of power changes in the electrical energy usage at the premise that are attributable to a same load of the plurality of electrical loads at the premise, wherein the clustering comprises analyzing power changes in the electrical energy usage based on usage statistics for the plurality of electrical loads to identify power changes attributable to the same load;

calculating, using the at least one processor, a degree of similarity between clusters of tuples of power changes based at least in part on times associated with power changes in the clusters;

merging, using the at least one processor, clusters of tuples of power changes having a degree of similarity above a threshold;

updating, using the at least one processor, the usage statistics to estimate times different loads of the plurality of electrical loads are in different states; and based on the updated usage statistics, processing, using the at least one processor, real-time power-change measurements to develop real-time load state information based on detected power changes in the electrical energy usage.

2. The method of claim 1 further including associating the real-time load state information with identifiable loads of the plurality of electrical loads at the premise.

3. The method of claim 2, wherein associating the real-time load state information with identifiable loads comprises correlating known load actions with the updated usage statistics.

4. The method of claim 1 wherein calculating the degree of similarity between clusters and merging clusters based on the degree of similarity comprises applying a Viterbi algorithm to analyze power changes that may be associated with state transitions of known loads, wherein applying the Viterbi algorithm comprises analyzing power changes based at least in part on transition probabilities between states of the known loads.

5. A method for nonintrusive monitoring of electrical energy usage by a plurality of electrical loads at a premise to which electrical power is supplied via a common feed, comprising:
   a. via a sensor, providing a sensor output signal indicative of power delivered through the feed over a first time interval;
   b. monitoring, using at least one processor, the sensor output signal to detect positive and negative changes of power, power surge amplitudes and durations;
   c. clustering, using the at least one processor, negative changes of power, wherein clustering negative changes in power comprises:
      clustering, using the at least one processor, tuples of power changes in the electrical energy usage at the premise that are attributable to a same load of the plurality of electrical loads at the premise, wherein the clustering comprises analyzing power changes in the electrical energy usage based on usage statistics for the plurality of electrical loads to identify power changes attributable to the same load;
      calculating, using the at least one processor, a degree of similarity between clusters of tuples of power changes based at least in part on times associated with power changes in the clusters; and
      merging, using the at least one processor, clusters of tuples of power changes having a degree of similarity above a threshold;
   d. matching, using the at least one processor, negative and positive changes of power;
   e. estimating, using the at least one processor, times loads were turned on and turned off during a second time interval; and
   f. statistically, using the at least one processor, characterizing the operation of at least one of said loads.

6. The method of claim 5, wherein:
the clustering further comprises:
   g. sorting clusters according to their mean values;
   h. applying a Viterbi algorithm to tuples of clusters; and
   i. resolving cluster conflicts to provide a set of clusters disambiguating power changes; and
the method further comprises:
   j. estimating appliance states based on the power changes represented by said set of clusters.

7. The method of claim 6, further comprising updating clustering and appliance feature statistics based on the results of steps i and j.

8. The method of claim 7, further comprising, for a second time interval shorter than and later than the first time interval, re-performing steps g-j on clusters created from power changes sensed by the sensor during the second time interval.

9. A system for nonintrusive monitoring of electrical energy usage by a plurality of electrical loads at a premise to which electrical power is supplied via a common feed, comprising:
   a. a power sensor configured and arranged to monitor aggregate power consumed at the premise;
   b. means for detecting changes in the monitored power; and
   c. a processor executing stored program instructions to disambiguate the detected power changes and associate them with individual loads by clustering power changes and, by means of a Viterbi algorithm, matching clusters to identify power changes associated with individual loads, wherein clustering the power changes comprises:
      clustering tuples of power changes in the electrical energy usage at the premise that are attributable to a same load of the plurality of electrical loads at the premise, wherein the clustering comprises analyzing power changes in the electrical energy usage based on usage statistics for the plurality of electrical loads to identify power changes attributable to the same load;
      calculating a degree of similarity between clusters of tuples of power changes based at least in part on times associated with power changes in the clusters; and
      merging clusters of tuples of power changes having a degree of similarity above a threshold.

10. The method of claim 1, further comprising calculating the usage statistics based for the plurality of electrical loads, for use in the clustering, based on an analysis of the electrical energy usage at the premise.

* * * * *